US012666934B2

(12) United States Patent
Yonezawa et al.

(10) Patent No.: US 12,666,934 B2
(45) Date of Patent: Jun. 23, 2026

(54) METHOD OF VIA FILLING

(71) Applicant: Tokyo Electron Limited, Tokyo (JP)

(72) Inventors: Ryota Yonezawa, Albany, NY (US);
Kai-Hung Yu, Albany, NY (US); **Ying
Trickett, Albany, NY (US); Hidenao
Suzuki**, Albany, NY (US)

(73) Assignee: Tokyo Electron Limited, Tokyo (JP)

( * ) Notice: Subject to any disclaimer, the term of this
patent is extended or adjusted under 35
U.S.C. 154(b) by 367 days.

(21) Appl. No.: 18/471,823

(22) Filed: Sep. 21, 2023

(65) Prior Publication Data

US 2025/0105059 A1 Mar. 27, 2025

(51) Int. Cl.
*H10W 20/00* (2026.01)
*H10P 14/692* (2026.01)
*H10W 20/41* (2026.01)

(52) U.S. Cl.
CPC ..... *H10W 20/057* (2026.01); *H10P 14/69215*
(2026.01); *H10W 20/0523* (2026.01); *H10W
20/089* (2026.01); *H10W 20/096* (2026.01);
*H10W 20/425* (2026.01)

(58) Field of Classification Search
None
See application file for complete search history.

(56) References Cited

U.S. PATENT DOCUMENTS

| | | | |
|---|---|---|---|
| 7,438,949 B2 | 10/2008 | Weidman | |
| 8,247,030 B2 | 8/2012 | Suzuki et al. | |

| | | | | |
|---|---|---|---|---|
| 9,496,419 | B2 | 11/2016 | Sharangpani et al. | |
| 9,711,449 | B2 | 7/2017 | Yu et al. | |
| 10,629,433 | B2 | 4/2020 | Ishizaka | |
| 11,282,745 | B2 * | 3/2022 | Yu ..................... H01L 23/53252 | |
| 2018/0068885 | A1 | 3/2018 | Haukka et al. | |
| 2021/0098257 | A1 | 4/2021 | Sharma et al. | |
| 2022/0238323 | A1 | 7/2022 | Clark | |
| 2022/0325410 | A1 | 10/2022 | Yoon et al. | |
| 2023/0175117 | A1 | 6/2023 | Austin et al. | |

FOREIGN PATENT DOCUMENTS

| | | |
|---|---|---|
| KR | 20190003050 A | 1/2019 |
| KR | 20200101466 A | 8/2020 |

OTHER PUBLICATIONS

International Search Report and Written Opinion, PCT/US2024/
037410, Mailed Oct. 31, 2024, Total Pages 09.

* cited by examiner

*Primary Examiner* — Kyoung Lee
(74) *Attorney, Agent, or Firm* — Slater Matsil, LLP

(57) ABSTRACT

A method of processing a substrate includes exposing the
substrate to a boron-containing precursor to adsorb over the
substrate, where the substrate includes a dielectric layer
formed over a conductive layer, and the conductive layer is
exposed at a bottom of a recess formed in the dielectric layer.
The method includes exposing the adsorbed boron-contain-
ing precursor to a plasma and filling the recess with a
conductive fill material bottom up by a vapor deposition
process, where a vertical deposition rate of the conductive
fill material is greater than a lateral deposition rate of the
conductive fill material.

20 Claims, 9 Drawing Sheets

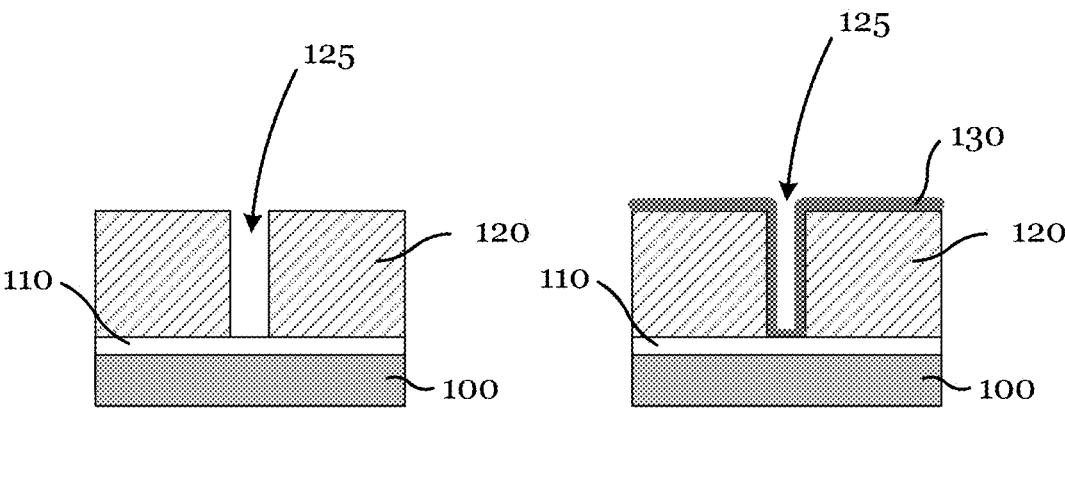
FIG. 1A                          FIG. 1B
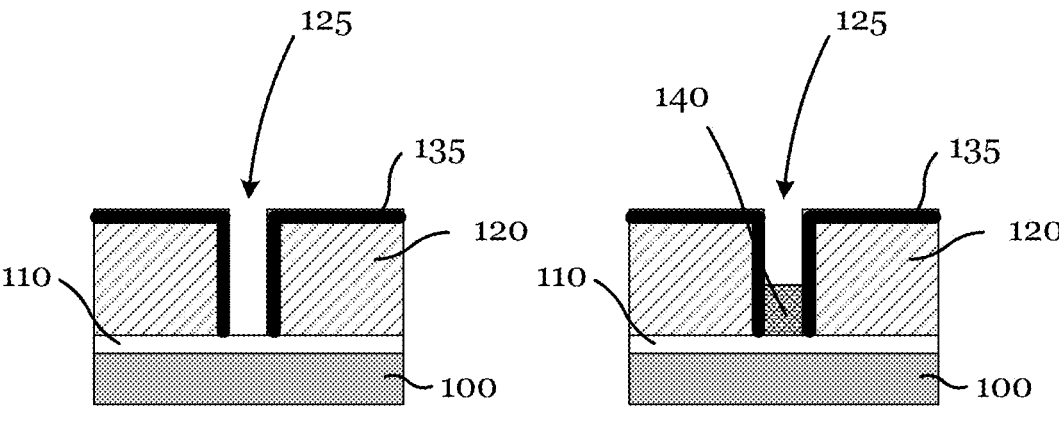
FIG. 1C                          FIG. 1D

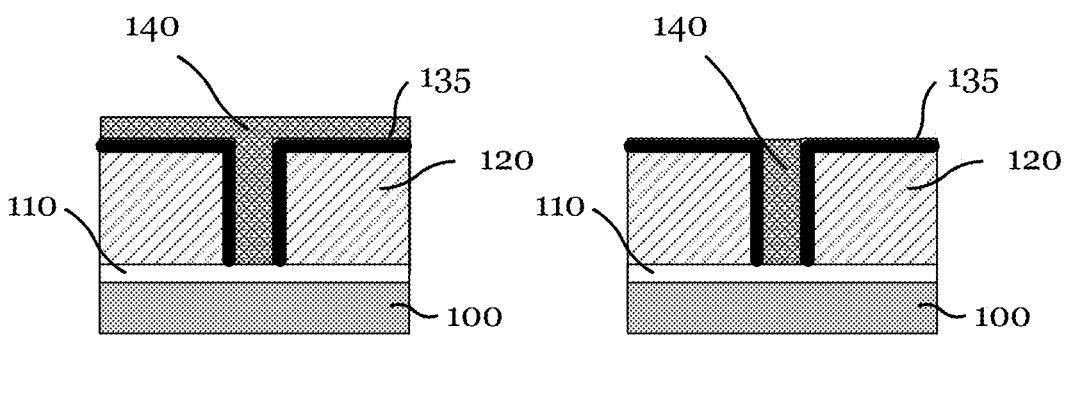
FIG. 1E                    FIG. 1F

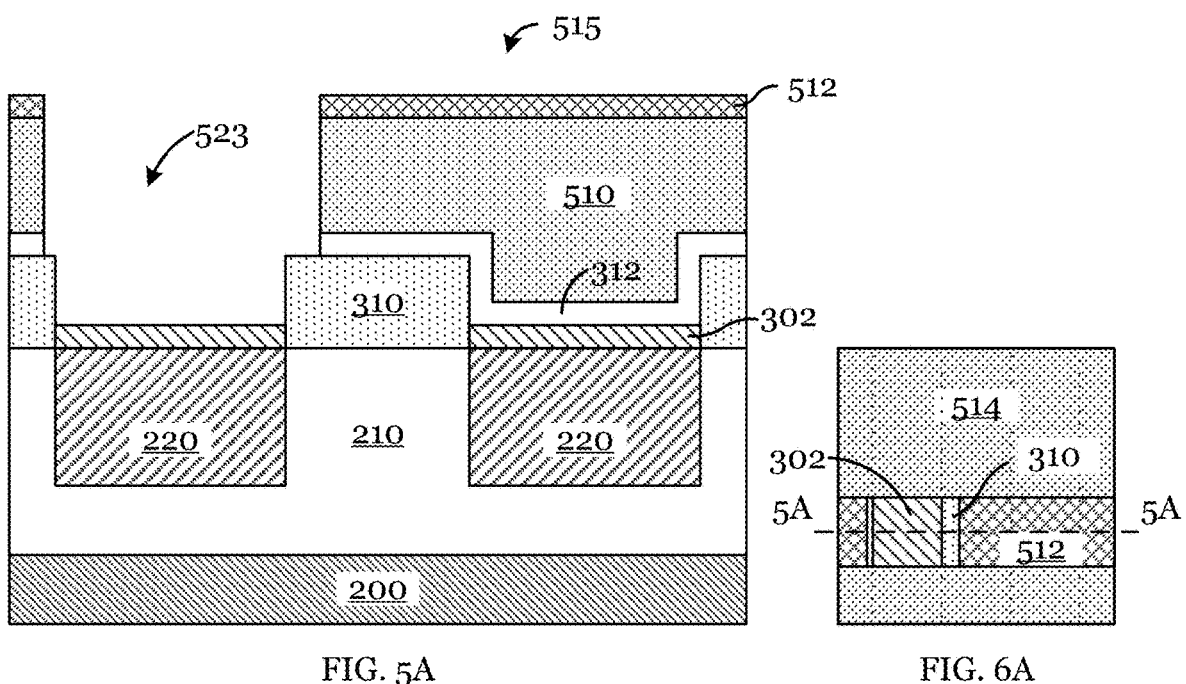
FIG. 5A                                FIG. 6A
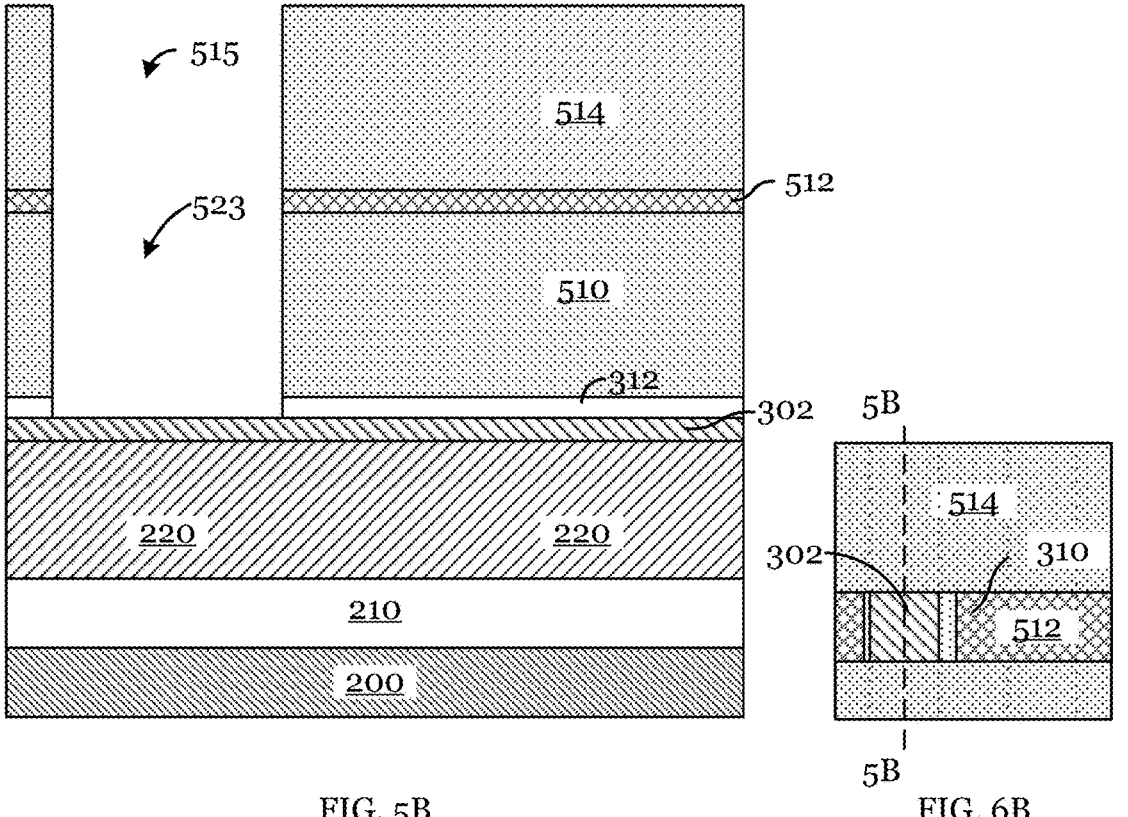
FIG. 5B                                FIG. 6B

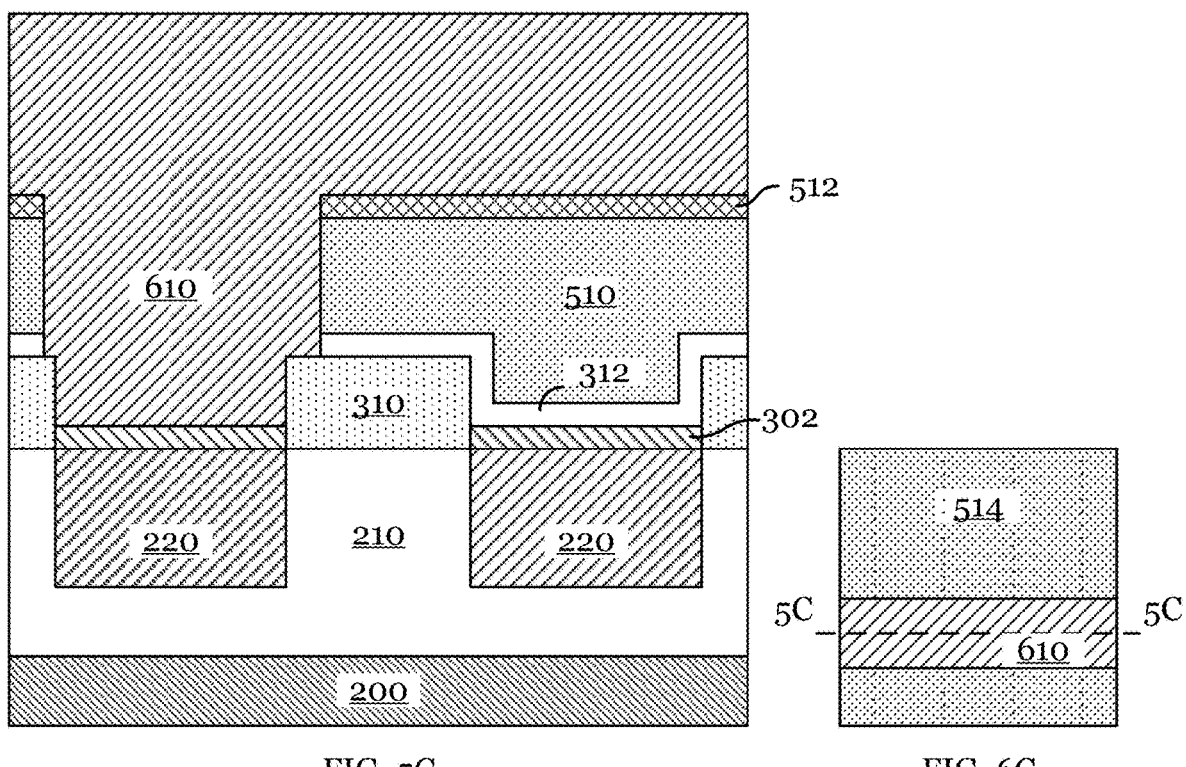
FIG. 5C
FIG. 6C
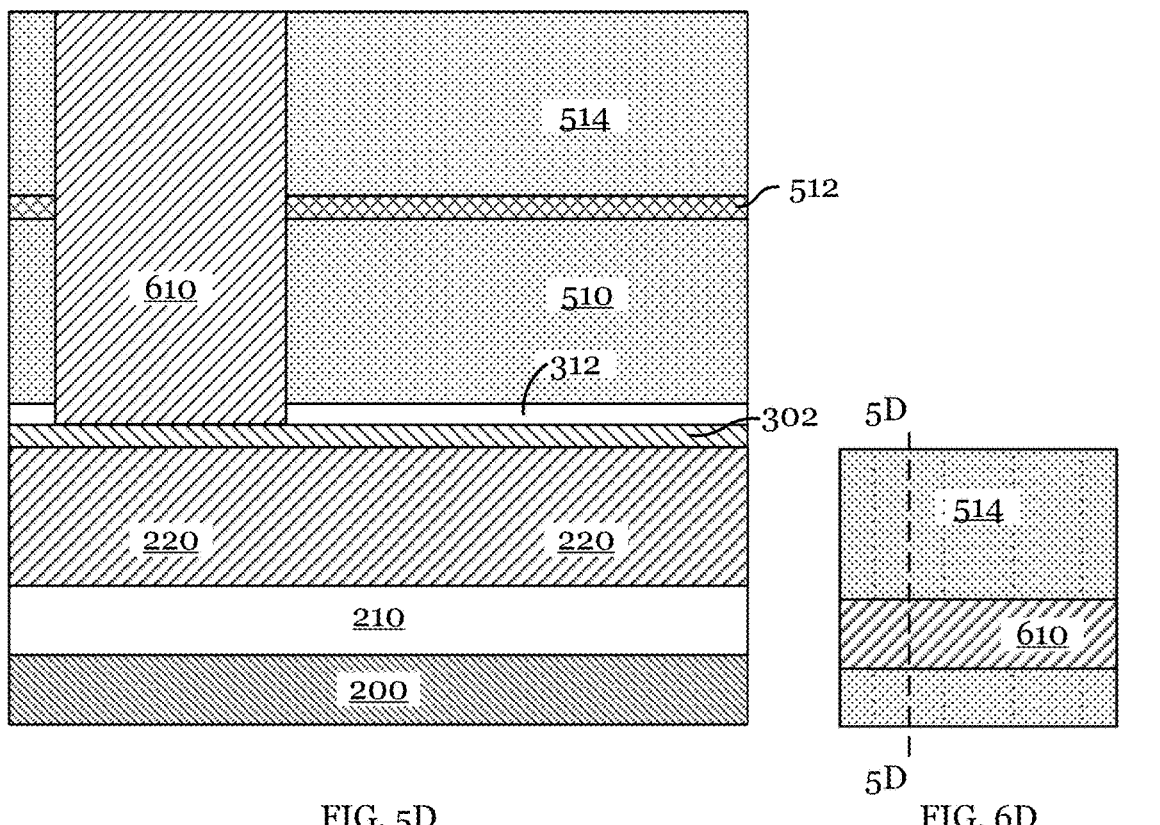
FIG. 5D
FIG. 6D

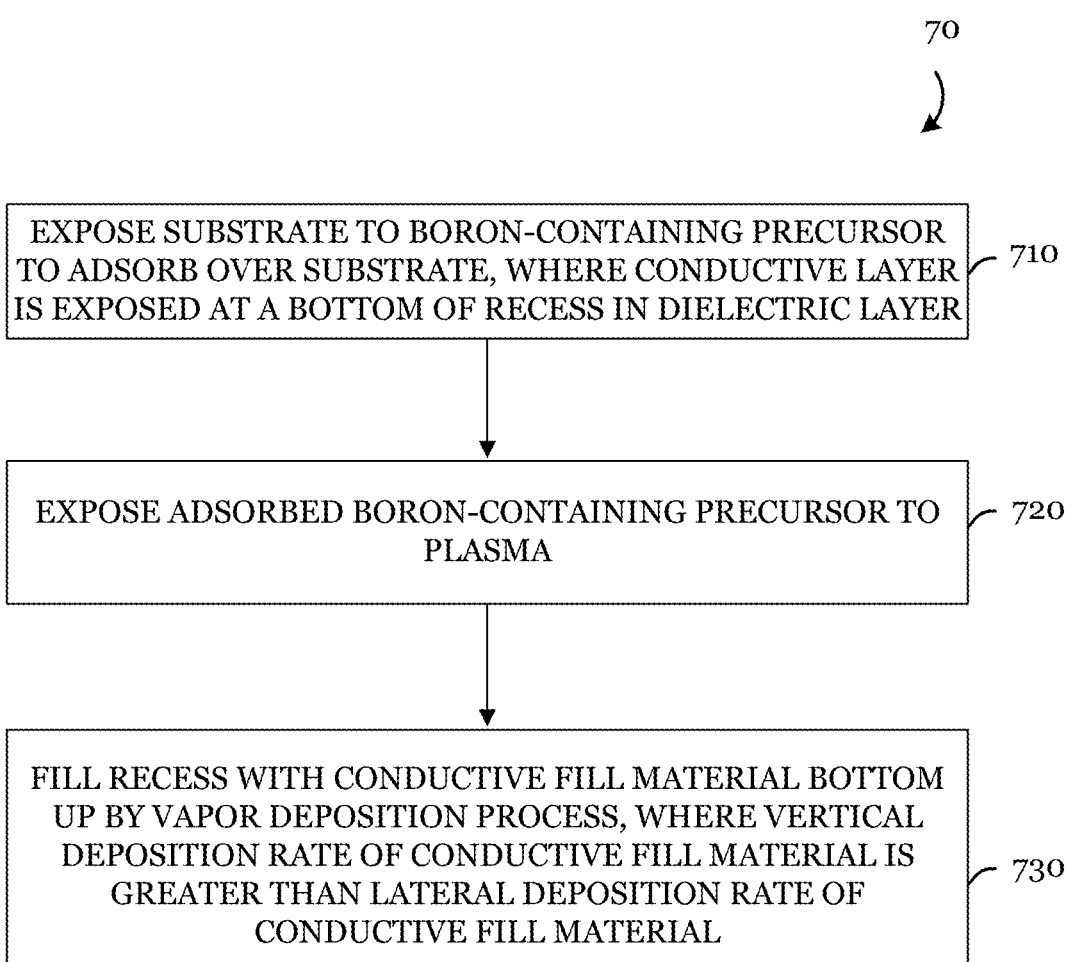

70

EXPOSE SUBSTRATE TO BORON-CONTAINING PRECURSOR TO ADSORB OVER SUBSTRATE, WHERE CONDUCTIVE LAYER IS EXPOSED AT A BOTTOM OF RECESS IN DIELECTRIC LAYER — 710

EXPOSE ADSORBED BORON-CONTAINING PRECURSOR TO PLASMA — 720

FILL RECESS WITH CONDUCTIVE FILL MATERIAL BOTTOM UP BY VAPOR DEPOSITION PROCESS, WHERE VERTICAL DEPOSITION RATE OF CONDUCTIVE FILL MATERIAL IS GREATER THAN LATERAL DEPOSITION RATE OF CONDUCTIVE FILL MATERIAL — 730

METHOD OF VIA FILLING

TECHNICAL FIELD

The present invention relates generally to methods of processing a substrate and, in particular embodiments, to via filling.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Process flows used to form the constituent structures of semiconductor devices often involve depositing and removing a variety of materials while a pattern of several materials may be exposed in a surface of the working substrate.

The minimum dimension of features in a patterned layer is shrunk periodically to roughly double the component density at each successive technology node, thereby reducing the cost per function. Innovations in patterning, such as immersion deep ultraviolet (i-DUV) lithography, multiple patterning, and 13.5 nm wavelength extreme ultraviolet (EUV) optical systems have brought some critical dimensions down close to ten nanometers. As the miniaturization progresses further, new problems are emerging in copper (Cu) wiring. That is, the wiring width used in the device has become even small than the mean free path of electrons in a Cu material, causing an increase in resistance value due to scattering. Therefore, new wiring materials for metal interconnects with superior material properties and their fabrication techniques may be desired at increasingly smaller scales.

SUMMARY

A method of processing a substrate includes exposing the substrate to a boron-containing precursor to adsorb over the substrate, where the substrate includes a dielectric layer formed over a conductive layer, and the conductive layer is exposed at a bottom of a recess formed in the dielectric layer. The method includes exposing the adsorbed boron-containing precursor to a plasma and filling the recess with a conductive fill material bottom up by a vapor deposition process, where a vertical deposition rate of the conductive fill material is greater than a lateral deposition rate of the conductive fill material.

A method of processing a substrate includes exposing the substrate to $BCl_3$ to adsorb over a surface of the substrate, where the surface includes a dielectric layer and a conductive layer. The method includes exposing the adsorbed $BCl_3$ to a plasma including argon and hydrogen, where the exposing to the plasma incorporates boron into the dielectric layer. The method includes depositing a metal over the surface, where a deposition rate of the metal is greater over the conductive layer than over the dielectric layer.

A method of forming a metal interconnect for a semiconductor device includes exposing a substrate including a via to a boron-containing precursor to adsorb over sidewalls of the via, where the via has a critical dimension of 20 nm or less and a conductive material is exposed at a bottom of the via. The method includes exposing the substrate to a plasma to induce boron doping to the sidewalls and filling the via with ruthenium (Ru) by a vapor deposition process, where the Ru is deposited preferentially from the bottom of the via than from the sidewalls.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1F illustrate cross sectional views of an example substrate during an example process of semiconductor fabrication comprising via filling at various stages in accordance with various embodiments, wherein FIG. 1A illustrates an incoming substrate comprising a recess in a dielectric layer, FIG. 1B illustrates the substrate after a boron exposure step, FIG. 1C illustrates the substrate after a plasma exposure step, FIG. 1D illustrates the substrate during a metal deposition step, FIG. 1E illustrates the substrate after completing the metal deposition step, and FIG. 1F illustrates the substrate after an etch back and planarization;

FIGS. 5A-5D illustrate cross-sectional views of another example substrate before (FIGS. 5A-5B) and after (FIGS. 5C-5D) via filling during a process flow forming a fully-self aligned via (FSAV) in accordance with other embodiments, wherein FIG. 5A illustrates a pre-filling cross section perpendicular to an underlying conductive line, FIG. 5B illustrates a pre-filling cross section parallel to the underlying conductive line, FIG. 5C illustrates a post-filling cross section perpendicular to the underlying conductive line, and FIG. 5D illustrates a post-filling cross section parallel to the underlying conductive line;

FIGS. 6A-6D illustrate the respective planar views of a top surface of the substrate illustrated in cross-sectional views in FIGS. 5A-5D; and FIGS. 7A-7C illustrate process flow charts of methods of via filling in accordance with various embodiments, wherein FIG. 7A illustrates an embodiment process flow, FIG. 7B illustrates an alternate embodiment process flow, and FIG. 7C illustrate another alternate embodiment process flow.

DETAILED DESCRIPTION OF ILLUSTRATIVE EMBODIMENTS

This application relates to a method of processing a substrate, more particularly to via filling. Techniques herein may be applied to and useful in fabricating metal interconnects in semiconductor devices at small scale. As device feature size continues to scale down, minimizing the electrical resistance has become a significant challenge especially for tight metal pitch. For example, the interconnect-RC delay of conventional copper (Cu) lines and tungsten (W) contacts may be limiting the speed of digital circuits. New materials are being introduced at the 10 nm nodes and below to replace dense Cu lines and W contacts. Ruthenium (Ru) metal is a leading candidate for replacing copper and tungsten in these and other applications. However, filling a recess having a tight pitch (e.g., <20 nm) with Ru uniformly without forming void remains a significant challenge. In most non-selective deposition methods, the metal deposition over the sidewalls may be predominant. Because the sidewalls accounts for the majority of exposed surface in a small via with a high aspect ratio (HAR), the non-selective deposition can form voids and cause a pinch-off issue. It is, therefore, desirable to have a selective bottom-up vapor deposition technique for Ru via filling.

Embodiments of the present application disclose methods of via filling with a conductive material such as Ru with a selective sidewall passivation. The methods of via filling in various embodiments may advantageously slow the deposition rate over the sidewalls in a recess to enable bottom-up deposition. The inventors of this application developed a method of selective sidewall passivation that may be applied prior to metal deposition to modify the surface of the substrate. In various embodiments, the selective sidewall passivation may comprise a boron exposure step to adsorb a boron-containing precursor (e.g., $BCl_3$) and a plasma exposure step (e.g., $Ar/H_2$ plasma) to remove boron only from the bottom surface but not from the sidewalls. The methods of via filling can be applied in fully self-aligned vias (FSAV) formation, where the bottom may be a conductive surface (e.g., TiN) and the via sidewalls may be a dielectric material (e.g., silicon oxide). During the selective sidewall passivation, the plasma exposure may induce a boron doping to the dielectric material, which may then suppress the metal deposition from the sidewall. As a result, various embodiments of the methods herein can enable the metal filling of a via or other recesses having a tight pitch size (e.g., <20 nm) without voids or pinch-off.

Figure 2:
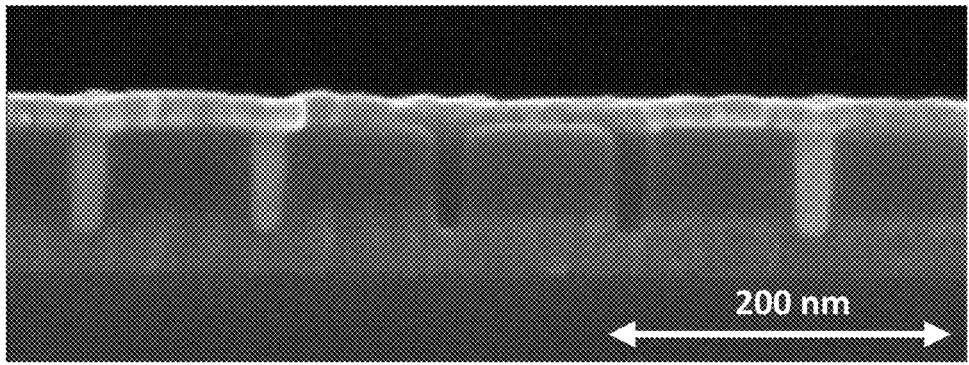
FIG. 2 illustrates a cross sectional scanning electron microscope (SEM) image of an example substrate after ruthenium (Ru) deposition with a boron exposure step.
Figure 3:
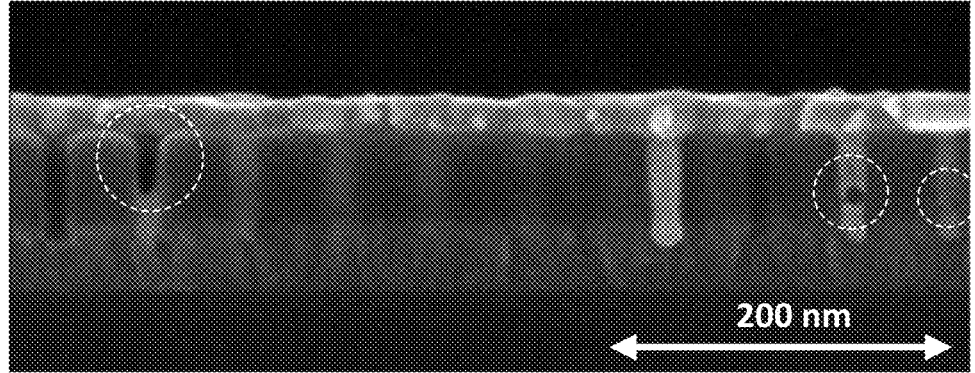
FIG. 3 illustrates a cross sectional scanning electron microscope (SEM) image of an example substrate after ruthenium (Ru) deposition without a boron exposure step.
Figure 4:
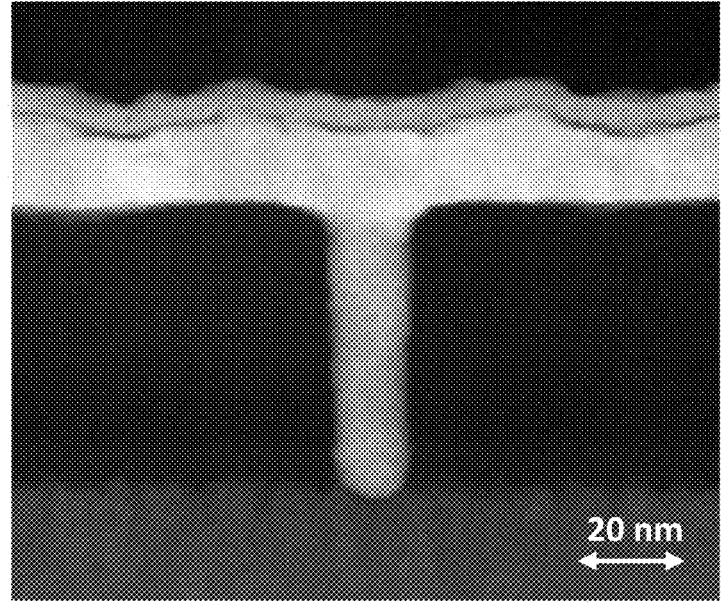
FIG. 4 illustrates a cross sectional transmission electron microscope (TEM) image of an example substrate after ruthenium (Ru) deposition with a boron exposure step.

In the following, FIGS. 1A-1F illustrate steps of a process of the via filling with selective sidewall passivation in accordance with various embodiments. Example SEM and TEM images of Ru filling are illustrated in FIGS. 2-4. The application of the method in fully self-aligned vias (FSAV) formation is then described referring to FIGS. 5A-5D and 6A-6D. Several embodiment process flows of via filling are described referring to FIGS. 7A-7C. All Figures in the disclosure, including the aspect ratios of features, are not to scale and for illustration purposes only. Although various embodiments of this disclosure primarily describe the metal filling of a via with sidewall passivation, the methods of deposition may be applied to fill any recess features (e.g., line and trench) or any surfaces where sidewall may not be present, as long as a portion of the surface can be selectively passivated by the methods described herein. In this disclosure, any list that presents possible compositions, conditions, or process variations includes any reasonable combination thereof, and thus the term "or" used in the list does not indicate any exclusive selection of a particular composition, condition, or process variation.

FIGS. 1A-1F illustrate cross sectional views of an example substrate during an example process of semiconductor fabrication comprising via filling at various stages in accordance with various embodiments.

In FIG. 1A, the substrate 100 may be a part of, or include, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

As illustrated in FIG. 1A, the substrate 100 may further comprise an electrically conductive layer (referred to as a conductive layer 110) and a dielectric layer 120, where a recess 125 may be formed in the dielectric layer 120. As illustrated in FIG. 1A, the conductive layer 110 may be exposed at the bottom of the recess 125. FIG. 1A illustrates only a simplified example of the substrate 100. In various embodiments, the substrate 100 may comprise a portion of a metal interconnect (e.g., conductive lines) for the semiconductor device below the conductive layer 110. The recess 125 may be a via, line recess, trench, or any other recess features, and may be bottom-up filled with a conductive fill (e.g., Ru) with sidewall passivation.

In various embodiments, the conductive layer 110 may be a barrier layer, an adhesion layer, or other liner layers to improve the deposition of the conductive fill. In certain embodiments, the conductive layer 110 may comprise titanium, titanium nitride, tantalum, tantalum nitride, tungsten, molybdenum, cobalt, or a combination thereof. In certain embodiments, the thickness of the conductive layer 110 may be in a range of 0.1 nm to 10 nm. The conductive layer 110 may be formed by, for example, ALD, CVD, or ionized physical vapor deposition (iPVD).

In another embodiment, the conductive layer 110 may be a top surface of a conductive line and comprise aluminum (Al), copper (Cu), molybdenum (Mo), ruthenium (Ru), tungsten (W), or osmium (Os). In various embodiments, the dielectric layer 120 may be an interlayer dielectric (ILD) formed for via formation, and may comprise silicon oxide or a low-k dielectric such as fluorosilicate glass (FSG) or carbon-doped silicon oxide (CDO). In various embodiments, the recess 125 may have a critical dimension (CD) less than 50 nm, and in certain embodiments, less than 20 nm. In one or more embodiments, the recess 125 may have an aspect ratio (AR) between 5:1 and 100:1.

The small CD and high aspect ratio (HAR) of a recess makes it difficult to fill with a metal without any void because the metal deposition may occur on the sidewalls, which account for a majority of the surface within the recess. Accordingly, preferential bottom-up deposition may be highly desired to overcome the issue of pinch off and void formation. For this purpose, in various embodiments, the selective sidewall passivation may be performed as described below (FIGS. 1B-1C) in order to suppress the deposition on the sidewalls during the filling process (FIGS. 1D-1E).

FIG. 1B illustrates a cross sectional view of the substrate 100 after a boron exposure step.

In various embodiments, the first step of the selective sidewall passivation may be a boron exposure step to adsorb a boron-containing precursor. The boron exposure step may comprise exposing the substrate 100, where a boron-containing surface layer 130 may be formed. As illustrated in FIG. 1B, the boron-containing surface layer 130 may be formed conformally and covering the sidewalls within the recess 125. In certain embodiments, the boron-containing surface layer 130 may be formed non-selectively and covering the surfaces of both the conductive layer 110 (i.e., top surface and sidewalls) and the dielectric layer 120 (i.e., bottom surface within the recess 125). Although not wishing to be limited by any theory, the boron-containing surface layer 130 may be a layer of adsorbed species of the boron-containing precursor. Accordingly, the boron-containing surface layer 130 may have a thickness of only a monolayer or several atomic layers in certain embodiments, or the surface may not entirely covered with the boron-containing surface layer 130 in one embodiment. In various embodiments, the boron-containing precursor may comprise borane ($B_2H_6$), boron halide (e.g., $BF_3$, $BCl_3$, and $BBr_3$), or other boron compounds. In one embodiment, the boron-containing precursor may comprise $BCl_3$. In certain embodiments, the boron-containing precursor may be flowed into a processing chamber for the process as an admixture comprising other gases such as a noble gas or dinitrogen ($N_2$).

In various embodiments, the boron exposure step may be a non-plasma process performed in the absence of plasma. The absence of plasma may be advantageous to ensure the isotropy of the process and the interaction between the boron-containing precursor and the sidewalls. In certain embodiments, the boron exposure step may be performed at a pressure of about 0.5 Torr to about 10 Torr, and at a temperature of about 10° C. to about 250° C. In one or more embodiments, the temperature may be between 200° C. and 250° C., and in another embodiment, it may be kept below 300° C. to be within a typical thermal budget in back-end-of-line (BEOL) processes.

FIG. 1C illustrates a cross sectional view of the substrate after a plasma exposure step.

After the boron exposure step, a plasma exposure step may be performed to remove the boron-containing surface layer 130 only from the bottom surface but not from the sidewalls. In addition, the boron-containing surface layer 130 may be converted to a passivation layer 135 over the surface of the dielectric layer 120. Because the plasma may be adjusted to be directional with anisotropy to selectively remove the boron-containing surface layer 130 only from the bottom surface (i.e., the conductive layer 110), the passivation layer 135 may be present only over the top surface and sidewalls of the dielectric layer 120 as illustrated in FIG. 1C.

In certain embodiments, the passivation layer 135 may be formed as a boron-doped dielectric layer over an exposed portion of the dielectric layer 120. Accordingly, there may not be a distinct interface between the passivation layer 135 and the dielectric layer 120 below it. In other words, the series of the boron exposure step and the plasma exposure step may be performed as a selective boron-doping process to modify the surface of the dielectric layer 120 relative to the conductive layer 110.

In various embodiments, the plasma for the plasma exposure step may comprise hydrogen, for example, generated from dihydrogen ($H_2$). Further, in certain embodiments, the plasma may include a noble gas such as argon (Ar). In one embodiment, $Ar/H_2$ plasma with an Ar to $H_2$ ratio of 80:20 may be used. In general, a hydrogen plasma treatment may be applied at various stages during semiconductor fabrication, for example as a cleaning step for removing a surface oxide over a metal surface or chlorine (Cl) contaminants. In various embodiments, the plasma exposure step of the selective sidewall passivation may advantageously be integrated with such a cleaning step and thereby introduced in a process flow without a substantial additional process cost. In various embodiments, for the plasma conditions, the source power may be between 50 W and 1000 W and the bias power may be between 0 W and 500 W. Total gas flow may be between 20 to 2000 sccm. Process pressure may be between 5 to 5000 mTorr. Temperature may be about 10° C. to about 250° C. in one embodiment, and in another embodiment, it may be between 200° C. and 250° C. In certain embodiments, the plasma exposure step may be performed with zero to little bias power such that the impact of the plasma treatment is enabled over the sidewalls and not substantial at the bottom surface. When the bias power is too strong, the boron species may chemically interact with the surface of the conductive layer 110 at the bottom instead of being removed from the surface.

FIG. 1D illustrates a cross sectional view of the substrate during a metal deposition step.

After the selective sidewall passivation with forming the passivation layer 135, the metal deposition step may be performed. In various embodiments, this deposition step may not be limited to a pure metal, and any alloys or conductive materials may be used. An electrically conductive fill (referred to as conductive fill 140 in this disclosure) may be deposited using a vapor deposition process to fill the recess 125. FIG. 1D illustrates an intermediate stage where only a portion of the recess 125 is filled with the conductive fill 140. In various embodiments, thanks to the passivation layer 135, the deposition process bottom up, where a vertical deposition rate of the conductive fill 140 (from the bottom) is greater than a lateral deposition rate of the conductive fill 140 (over the sidewalls). This bottom-up deposition may advantageously enable the void-free filling of the recess 125.

In various embodiments, the conductive fill 140 may comprise ruthenium (Ru). In certain embodiments, chemical vapor deposition (CVD) may be used. For example, A Ru precursor, ruthenium carbonyl ($Ru_3(CO)_{12}$) may be flowed into the deposition chamber containing the substrate 100, where ($Ru_3(CO)_{12}$) may be thermally decomposed on the surface and a high-purity thin Ru film may be formed within the recess 125. In one or more embodiments, the process conditions for Ru deposition may be as follows: the pressure within the deposition chamber in a range of 0.1 mTorr to 1 Torr, preferably in a range of 10 mTorr to 500 mTorr, and the substrate temperature in a range of 120° C. to 300° C., preferably in a range of 130° C. to 250° C.

In other embodiments, the Ru deposition may be performed using a Ru pentadienyl compound such as (cyclo-pentadienyl) (2,4-dimethylpentadienyl) ruthenium, bis(cy-clopentadienyl) (2,4-methylpentadienyl) ruthenium, (2,4-dimethylpentadienyl) (ethylcyclopentadienyl) ruthenium, or bis(2,4-methylpentadienyl) (ethylcyclopentadienyl) ruthenium. When using these precursors, the CVD may also use a reducing gas in addition to the Ru precursor.

In alternate embodiments, the conductive fill 140 may comprise aluminum (Al), copper (Cu), cobalt (Co), tungsten (W), osmium (Os), or molybdenum (Mo). In one or more embodiments, more than one materials may be used to fill the recess 125. For example, a seed layer useful for metal deposition may be first selectively deposited over the substrate 100, followed by a second deposition for the main conductive fill.

FIG. 1E illustrates a cross sectional view of the substrate after completing the metal deposition step.

After completing the metal deposition step, the recess 125 (FIGS. 1A-1D) may be completely filled with the conductive fill 140 without any void. As illustrated in FIG. 1E, an excess amount of the conductive fill 140 may be deposited over the substrate 100, covering the entire surface including the top surface of the dielectric layer 120.

In certain embodiments, an optional annealing treatment may be performed after the metal deposition step to reduce electrical resistance of the conductive fill 140 by increasing the grain diameter of crystals (e.g., Ru in the conductive fill 140) and also to remove impurities such as, for example, carbon or oxygen in the conductive fill 140. The optional annealing treatment may be performed using a gas containing $H_2$ gas, for example, a forming gas ($H_2$+Ar or $H_2$+$N_2$).

FIG. 1F illustrates a cross sectional view of the substrate after an etch back and planarization.

In various embodiments, the excess amount of the conductive fill 140 may be removed and the surface may be planarized, for example, by a chemical mechanical planarization (CMP) process. As a result, as illustrated in FIG. 1F, the top surface of the dielectric layer 120 may be free of the conductive fill 140.

The process flow described above referring to FIGS. 1A-1F may be modified in certain embodiments to further improve the process efficiency and the sidewall passivation. In one embodiment, the two plasma exposure steps may be performed for the selective sidewall passivation: the first plasma exposure step (e.g., $H_2$/Ar plasma) before the boron exposure step and the second plasma exposure step (e.g., $H_2$/Ar plasma) after the boron exposure step. Such an embodiment with three steps may advantageously help further removing impurities and surface oxides prior to the treatment with boron.

The inventors of this application demonstrated the preferential interaction of boron with a dielectric surface relative to a conductive surface by experimentally investigating the effect of a boron treatment on metal deposition over different surfaces. To examine the selectivity useful in forming metal interconnects in semiconductor devices, silicon oxide ($SiO_2$) and titanium nitride (TiN) were studied. TiN is a conductive material useful as an adhesion layer for metal deposition such as Ru deposition. First, the two surfaces ($SiO_2$ and TiN) were treated with $BCl_3$ and $H_2$/Ar plasma, and their surface compositions after each treatment were characterized using x-ray photoelectron spectroscopy (XPS). The XPS analysis revealed that, over $SiO_2$, some boron species may be present even after the plasma treatment. Over TiN, on the other hand, the XPS peak assigned to boron was significant after the $BCl_3$ exposure, but it disappeared after the plasma treatment. The results suggests the plasma treatment can induce a difference in boron concentration between the two surfaces. Chlorine (Cl) species were detected from both surfaces even after the plasma treatment. Second, metal deposition rate over these treated surfaces were examined using Ru as an example. In the presence of a certain level of Cl, the $BCl_3$ exposure followed by the plasma treatment only slowed the Ru deposition rate over $SiO_2$, while there is no substantial difference found over TiN. A similar trend of reduced deposition rate after the $BCl_3$ exposure followed by the plasma treatment was also confirmed for a low-k dielectric surface. Therefore, it has been demonstrated that the boron treatment followed by the plasma treatment can induce a preferential boron treatment (i.e., incorporating boron selectively over a dielectric surface), which can then lead to suppressing the metal deposition over the treated dielectric surface without substantially affecting the metal deposition over a conductive surface. Because the sidewalls in various applications of via filling may comprise a dielectric material, the suppression of the metal deposition over the treated dielectric surface may advantageously applied to sidewall passivation and help enabling bottom-up metal deposition. This is highly desirable especially at small scales with high aspect ratio (HAR) features where void formation and pinch off within recesses (e.g., vias) with the tight pitch size are a significant challenge. It was also found that the introduction of Cl to the surfaces also exhibited some effect of deposition rate suppression, but this effect was not significantly selective among the surfaces examined (i.e., the low-k dielectric, silicon oxide, and TiN), suggesting the importance of boron during the pre-deposition treatment.

FIG. 2 illustrates a cross sectional scanning electron microscope (SEM) image of an example substrate after ruthenium (Ru) deposition with a boron exposure step.

FIG. 3 illustrates a cross sectional scanning electron microscope (SEM) image of an example substrate after ruthenium (Ru) deposition without a boron exposure step.

FIG. 4 illustrates a cross sectional transmission electron microscope (TEM) image of an example substrate after ruthenium (Ru) deposition with a boron exposure step.

The effect of the boron exposure step on the Ru deposition is further examined using cross sectional SEM. The model Ru deposition experiments were conducted over the substrate comprising a TiN layer and a silicon oxide layer, where a series of recesses have sidewalls of the oxide layer and bottom surfaces of the TiN layer. Two conditions for pre-deposition treatment were studied: $BCl_3$ exposure followed by Ar/$H_2$ plasma exposure (FIG. 2) and only Ar/$H_2$ plasma exposure (FIG. 3). The cross sectional SEM images were taken after the Ru deposition to evaluate the quality of Ru filling in the recesses. Over the substrate with the $BCl_3$ exposure, all the recesses were successfully filled with Ru without any significant void (FIG. 2). On the other hand, over the substrate without the $BCl_3$ exposure (Ar/$H_2$ plasma treatment only), the Ru filling was not perfect and resulted in some voids as indicated by dotted circles in FIG. 3. The results support that the plasma process alone may not be able to suppress sidewall deposition and it is necessary to perform a boron exposure step to successfully passivate the surface of the dielectric layer (e.g., silicon oxide). The absence of any void in the substrate with the $BCl_3$ exposure was further confirmed with transmission electron microscopy (TEM) as illustrated in FIG. 4.

FIGS. 5A-5B illustrate cross-sectional views of another example substrate 200 before via filling during a process flow forming a self-aligned feature in accordance with other embodiments, wherein FIG. 5A illustrates a cross section perpendicular to an underlying conductive line 220, and FIG. 5B illustrates a cross section parallel to the underlying conductive line 220.

FIGS. 6A-6B illustrate the respective planar views of a top surface of the substrate 200 illustrated in cross-sectional views in FIGS. 5A-5B.

In the following, in accordance with certain embodiments, the application of the methods of via filling with selective sidewall passivation in fully self-aligned vias (FSAV) is described. The details of the boron exposure step and the plasma exposure step may be identical to those described above and thus will not be repeated. For brevity, the substrate structure after completing via formation and trench formation is illustrated.

In FIGS. 5A-5B, the substrate 200 may comprise a conductive line 220 embedded in a first dielectric layer 210 having a top dielectric surface substantially coplanar with the conductive surface of the conductive line 220. The conductive line 220 may comprise a metal such as copper (Cu) or ruthenium (Ru). In certain embodiments, a conductive liner 302 may be formed over the conductive surface of the conductive line 220. The conductive liner 320 may be for adhesion of a next conductive layer as well as to block diffusion of metal into the first dielectric layer 210, and may comprise, for example, titanium, titanium nitride, tantalum, tantalum nitride, or a combination thereof. The first dielectric layer 210 may comprise a low-k dielectric such as fluorosilicate glass (FSG) or carbon-doped silicon oxide (CDO) formed over the substrate 200.

Still referring to FIGS. 5A-5B, a roughly conformal first etch stop layer (ESL) 312 may be formed after a selective dielectric-on-dielectric (DoD) deposition of a second dielectric layer 310. An upper interconnect level may be formed by forming conductive elements embedded in an interlayer dielectric (ILD) layer formed over the first ESL 312. In various embodiments, the ILD layer comprises several dielectric layers formed in succession. A first ILD layer 510 may be formed over the first ESL 312, a second etch stop layer (ESL) 512 may be formed over the first ILD layer 510, and a second ILD layer 514 may be formed over the second ESL 512. The first ILD layer 510 and the second ILD layer 514 may comprise a low-k dielectric such as FSG or CDO. The trench formation may have been already performed to form a trench 515 in the second ILD layer 514 down to the level of the second ESL 512.

It is typical of conductive lines of an interconnect level to be oriented as parallel lines that are perpendicular to the parallel conductive lines of a vertically adjacent interconnect level. Accordingly, the exposed second ESL 512 at the bottom of the trench 515, illustrated in the planar view in FIGS. 6A-6B, is shown to be perpendicular to the conductive line 220 of the lower interconnect level, but it is understood that a different orientation may also be used. Further, because FIG. 5A illustrates the cross section parallel to and over the trench 515, the remaining portion of the second ILD layer 514 is not visible in FIG. 5A.

Further, a via 523 may be formed in the ILD, first by a via opening etch to extend the via 523 down to the first ESL 312, followed by a via landing etch to etch further and remove the exposed regions of the first ESL 312 and extends the via 523 to expose a top conductive surface (e.g., the surface of the conductive liner 302) as illustrated in FIGS. 5A-5B.

FIGS. 5C-5D illustrate cross-sectional views of a fully-self aligned via (FSAV) after via filling in accordance with other embodiments, wherein FIG. 5C illustrates a cross section perpendicular to an underlying conductive line, and FIG. 5D illustrates a cross section parallel to the underlying conductive line.

FIGS. 6C-6D illustrate the respective planar views of a top surface of the substrate illustrated in cross-sectional views in FIGS. 5C-5D.

The methods of via filling with selective sidewall passivation can be applied to deposit a conductive fill 610 (e.g., Ru) to fill both of the via 523 and the trench 515 illustrated in FIGS. 5A-5B. The boron exposure step and subsequent plasma step can advantageously passivate the sidewalls comprising the first ILD layer 510 and the second ILD layer 514, enabling the bottom-up deposition of the conductive fill 610. Advantageously, the deposition over the sidewall may be minimized or eliminated completely, thereby preventing void formation in the deposited conductive fill 610.

In FIGS. 5C-5D, after the deposition, an excess of the conductive fill 610 may be removed such that the conductive lines and vias of the upper interconnect level are inlaid in the ILD layer structure. In one embodiment, a metal CMP process may be used for damascene etch and planarization. The CMP etch may stop on the CMP etch stop layer of the second ILD layer 514.

Figure 7B:
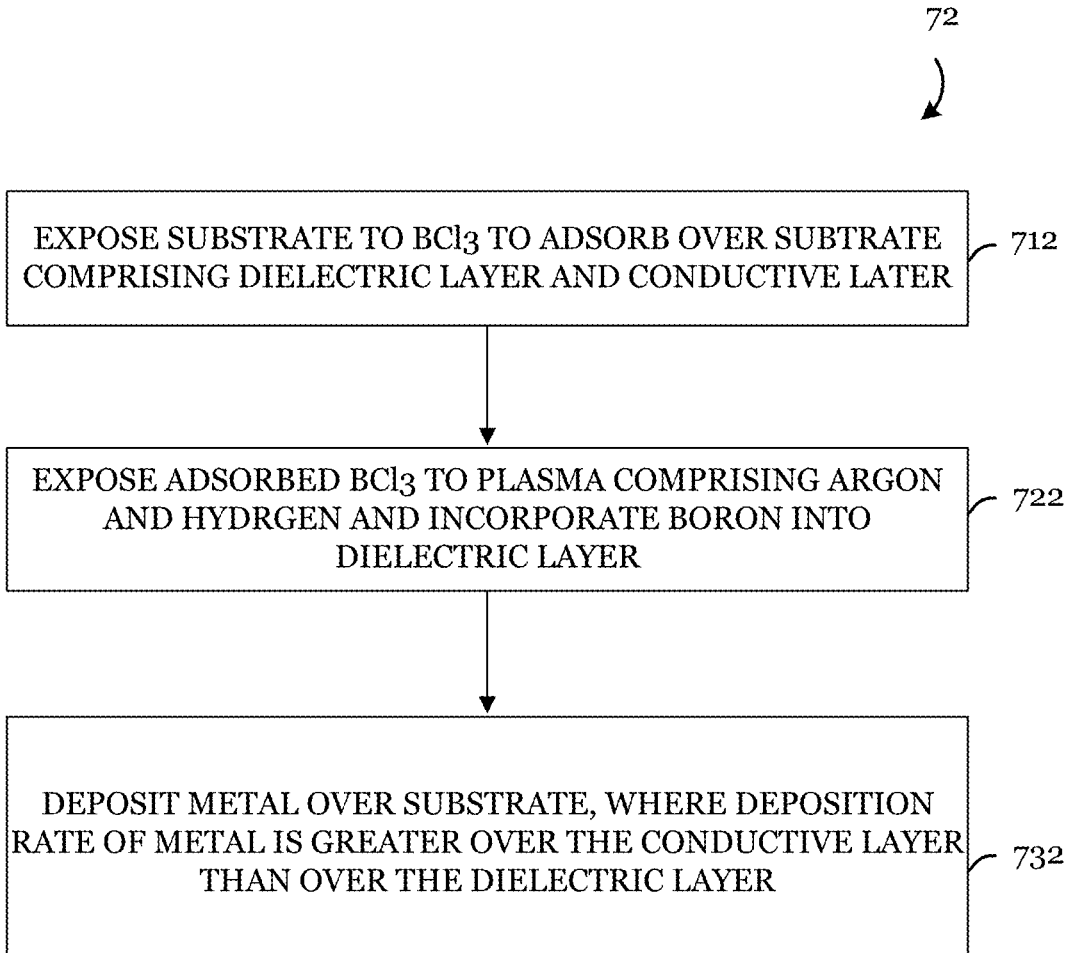
Figure 7C:
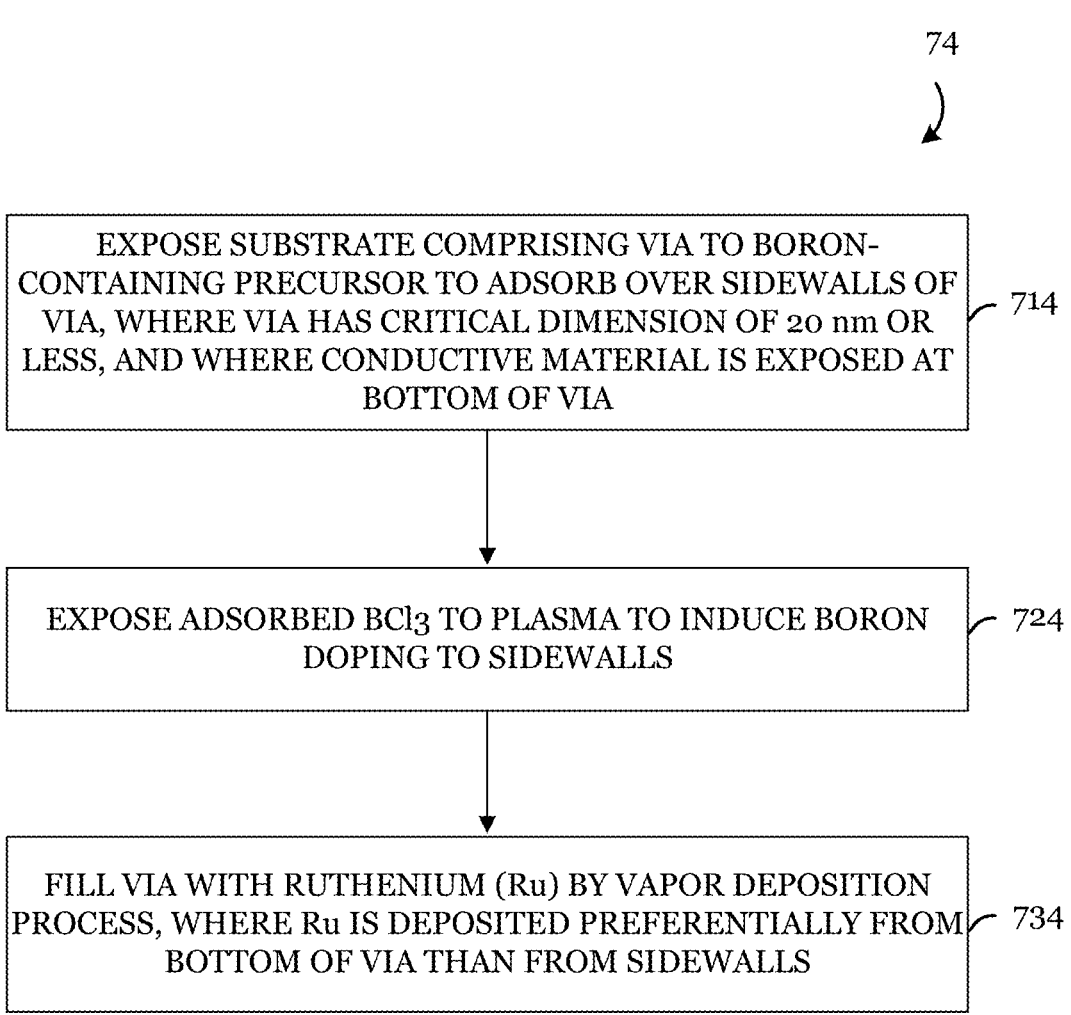

FIGS. 7A-7C illustrate process flow charts of methods of via filling in accordance with various embodiments. The process flow can be followed with the figures (e.g., FIGS. 1B-1E) discussed above and hence will not be described again.

In FIG. 7A, a process flow 70 starts with exposing a substrate to a boron-containing precursor to adsorb over the substrate, where the substrate comprises a dielectric layer formed over a conductive layer, and where the conductive layer is exposed at a bottom of a recess formed in the dielectric layer (block 710, FIG. 1B). Subsequently, the adsorbed boron-containing precursor may be exposed to a plasma (block 720, FIG. 1C), followed by filling the recess with a conductive fill material bottom up by a vapor deposition process, where a vertical deposition rate of the conductive fill material is greater than a lateral deposition rate of the conductive fill material (block 730, FIGS. 1D-1E).

In FIG. 7B, another process flow 72 starts with exposing a substrate to $BCl_3$ to adsorb over a surface of the substrate, where the surface comprises a dielectric layer and a conductive layer (block 712, FIG. 1B). Subsequently, the adsorbed $BCl_3$ may be exposed to a plasma comprising argon and hydrogen, where the exposing to the plasma incorporates boron into the dielectric layer (block 722, FIG. 1C), followed by depositing a metal over the surface, where a deposition rate of the metal is greater over the conductive layer than over the dielectric layer (block 732, FIG. 1D). In one or more embodiments, the steps of the exposing to $BCl_3$ and the exposing to the plasma may be repeated prior to the depositing.

In FIG. 7C, another process flow 74 starts with exposing a substrate comprising a via to a boron-containing precursor to adsorb over sidewalls of the via, where the via has a critical dimension of 20 nm or less, and a conductive material is exposed at a bottom of the via (block 714, FIG. 1B). Subsequently, the substrate may be exposed to a plasma to induce boron doping to the sidewalls (block 724, FIG. 1C), followed by filling the via with ruthenium (Ru) by a vapor deposition process, where the Ru is deposited preferentially from the bottom of the via than from the sidewalls (block 734, FIGS. 1D-1E).

Example embodiments of the invention are described below. Other embodiments can also be understood from the entirety of the specification as well as the claims filed herein.

Example 1. A method of processing a substrate includes exposing the substrate to a boron-containing precursor to adsorb over the substrate, where the substrate includes a dielectric layer formed over a conductive layer, and the conductive layer is exposed at a bottom of a recess formed in the dielectric layer. The method includes exposing the adsorbed boron-containing precursor to a plasma and filling the recess with a conductive fill material bottom up by a vapor deposition process, where a vertical deposition rate of the conductive fill material is greater than a lateral deposition rate of the conductive fill material.

Example 2. The method of example 1, where the boron-containing precursor includes a boron halide or a borane.

Example 3. The method of one of examples 1 or 2, where the boron-containing precursor includes $B_2H_6$, $BF_3$, $BCl_3$, or $BBr_3$.

Example 4. The method of one of examples 1 to 3, where the conductive layer includes ruthenium (Ru), tungsten (W), or titanium (Ti).

Example 5. The method of one of examples 1 to 4, where the plasma includes argon and hydrogen.

Example 6. The method of one of examples 1 to 5, where the dielectric layer includes silicon oxide, and where the exposing to the plasma inducing boron doping in the silicon oxide.

Example 7. The method of one of examples 1 to 6, where the conductive fill material includes ruthenium (Ru), tungsten (W), or molybdenum (Mo).

Example 8. The method of one of examples 1 to 7, where the exposing to the plasma removes boron from the conductive layer.

Example 9. A method of processing a substrate includes exposing the substrate to $BCl_3$ to adsorb over a surface of the substrate, where the surface includes a dielectric layer and a conductive layer. The method includes exposing the adsorbed $BCl_3$ to a plasma including argon and hydrogen, where the exposing to the plasma incorporates boron into the dielectric layer. The method includes depositing a metal over the surface, where a deposition rate of the metal is greater over the conductive layer than over the dielectric layer.

Example 11. The method of one of examples 9 or 10, where the substrate includes a recess, the conductive layer being exposed at a bottom of the recess and the dielectric layer including sidewalls of the recess.

Example 12. The method of one of examples 9 to 11, where the exposing to $BCl_3$ is performed in the absence of plasma.

Example 13. The method of one of examples 9 to 12, where the metal includes ruthenium (Ru), tungsten (W), or molybdenum (Mo).

Example 14. The method of one of examples 9 to 13, where the conductive layer includes titanium nitride or tantalum nitride.

Example 15. A method of forming a metal interconnect for a semiconductor device includes exposing a substrate including a via to a boron-containing precursor to adsorb over sidewalls of the via, where the via has a critical dimension of 20 nm or less and a conductive material is exposed at a bottom of the via. The method includes exposing the substrate to a plasma to induce boron doping to the sidewalls and filling the via with ruthenium (Ru) by a vapor deposition process, where the Ru is deposited preferentially from the bottom of the via than from the sidewalls.

Example 16. The method of example 15, where the via have aspect ratio between 5:1 and 100:1.

Example 17. The method of one of examples 15 or 16, where the via is filled with Ru without a void.

Example 18. The method of one of examples 15 to 17, where the boron-containing precursor includes $BCl_3$, and where the plasma including argon and hydrogen.

Example 19. The method of one of examples 15 to 18, where the conductive material includes titanium nitride.

Example 20. The method of one of examples 15 to 19, where the sidewalls include an oxide.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:

exposing the substrate to a boron-containing precursor to adsorb over the substrate, the substrate comprising a dielectric layer formed over a conductive layer, the conductive layer being exposed at a bottom of a recess formed in the dielectric layer, exposing the adsorbed boron-containing precursor to a plasma; and filling the recess with a conductive fill material bottom up by a vapor deposition process, wherein a vertical deposition rate of the conductive fill material is greater than a lateral deposition rate of the conductive fill material.

2. The method of claim 1, wherein the boron-containing precursor comprises a boron halide or a borane.

3. The method of claim 1, wherein the boron-containing precursor comprises $B_2H_6$, $BF_3$, $BCl_3$, or $BBr_3$.

4. The method of claim 1, wherein the conductive layer comprises ruthenium (Ru), tungsten (W), or titanium (Ti).

5. The method of claim 1, wherein the plasma comprises argon and hydrogen.

6. The method of claim 1, wherein the dielectric layer comprises silicon oxide, and wherein the exposing to the plasma inducing boron doping in the silicon oxide.

7. The method of claim 1, wherein the conductive fill material comprises ruthenium (Ru), tungsten (W), or molybdenum (Mo).

8. The method of claim 1, wherein the exposing to the plasma removes boron from the conductive layer.

9. A method of processing a substrate, the method comprising:

exposing the substrate to $BCl_3$ to adsorb over a surface of the substrate, the surface comprising a dielectric layer and a conductive layer;

exposing the adsorbed $BCl_3$ to a plasma comprising argon and hydrogen, the exposing to the plasma incorporating boron into the dielectric layer; and depositing a metal over the surface, wherein a deposition rate of the metal is greater over the conductive layer than over the dielectric layer.

10. The method of claim 9, further comprising, prior to the depositing, repeating the steps of the exposing to $BCl_3$ and the exposing to the plasma.

11. The method of claim 9, wherein the substrate comprises a recess, the conductive layer being exposed at a bottom of the recess and the dielectric layer comprising sidewalls of the recess.

12. The method of claim 9, wherein the exposing to $BCl_3$ is performed in the absence of plasma.

13. The method of claim 9, wherein the metal comprises ruthenium (Ru), tungsten (W), or molybdenum (Mo).

14. The method of claim 9, wherein the conductive layer comprises titanium nitride or tantalum nitride.

15. A method of forming a metal interconnect for a semiconductor device, the method comprising:

exposing a substrate comprising a via to a boron-containing precursor to adsorb over sidewalls of the via, the via having a critical dimension of 20 nm or less, a conductive material being exposed at a bottom of the via;

exposing the substrate to a plasma to induce boron doping to the sidewalls; and filling the via with ruthenium (Ru) by a vapor deposition process, the Ru being deposited preferentially from the bottom of the via than from the sidewalls.

16. The method of claim 15, wherein the via has an aspect ratio between 5:1 and 100:1.

17. The method of claim 15, wherein the via is filled with Ru without a void.

18. The method of claim 15, wherein the boron-containing precursor comprises $BCl_3$, and wherein the plasma comprising argon and hydrogen.

19. The method of claim 15, wherein the conductive material comprises titanium nitride.

20. The method of claim 15, wherein the sidewalls comprise an oxide.

* * * * *